United States Patent
Aoki

(10) Patent No.: US 7,852,386 B2
(45) Date of Patent: Dec. 14, 2010

(54) SOLID STATE IMAGING DEVICE AND METHOD FOR DRIVING SAME AND IMAGING APPARATUS

(75) Inventor: Keigo Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 1282 days.

(21) Appl. No.: 11/366,126

(22) Filed: Mar. 2, 2006

(65) Prior Publication Data

US 2006/0203112 A1   Sep. 14, 2006

(30) Foreign Application Priority Data

Mar. 9, 2005   (JP) .............. P2005-065605

(51) Int. Cl.
  *H04N 9/64*   (2006.01)
  *H04N 3/14*   (2006.01)
  *H04N 5/335*   (2006.01)
  *H04N 5/217*   (2006.01)

(52) U.S. Cl. ............ 348/245; 348/308; 348/241; 348/300; 348/301; 348/302

(58) Field of Classification Search .......... 348/308, 348/24, 243, 245, 300–302, 296
See application file for complete search history.

(56) References Cited

U.S. PATENT DOCUMENTS 5,724,094 A * 3/1998 Tseng et al. ............. 348/243

2004/0233310 A1 * 11/2004 Egawa et al. ............. 348/301

FOREIGN PATENT DOCUMENTS

| JP | 2000-125203 | 4/2000 |
|---|---|---|
| JP | 2000-224492 | 8/2000 |
| JP | 2001-008109 | 1/2001 |
| JP | 2005-269098 | 9/2005 |

OTHER PUBLICATIONS

Japanese Office Action issued on Dec. 8, 2009 in connection with counterpart JP Application No. 2005-065605.

* cited by examiner

*Primary Examiner*—Lin Ye
*Assistant Examiner*—Chia-Wei A Chen
(74) *Attorney, Agent, or Firm*—SNR Denton US LLP

(57) ABSTRACT

A solid state imaging device including: a pixel portion having a plurality of pixels arrayed two-dimensionally and including an effective pixel portion and a dummy pixel portion; a timing generator for generating address information for reading signals of pixels of the pixel portion and timing signals for reading; a column decoder; a column selection circuit for generating transfer signals and reset signals used for control for reading signals of pixels in the column portions of the pixel portion by the plurality of line selection signals output from the column decoder based on the timing signals and selecting column portions of pixels in an effective portion and a dummy portion of the pixel portion; and a transfer circuit for reading signals of corresponding pixels based on the transfer signals and reset signals output from the column selection circuit, then transferring signals of read pixels by the row signal lines.

8 Claims, 8 Drawing Sheets

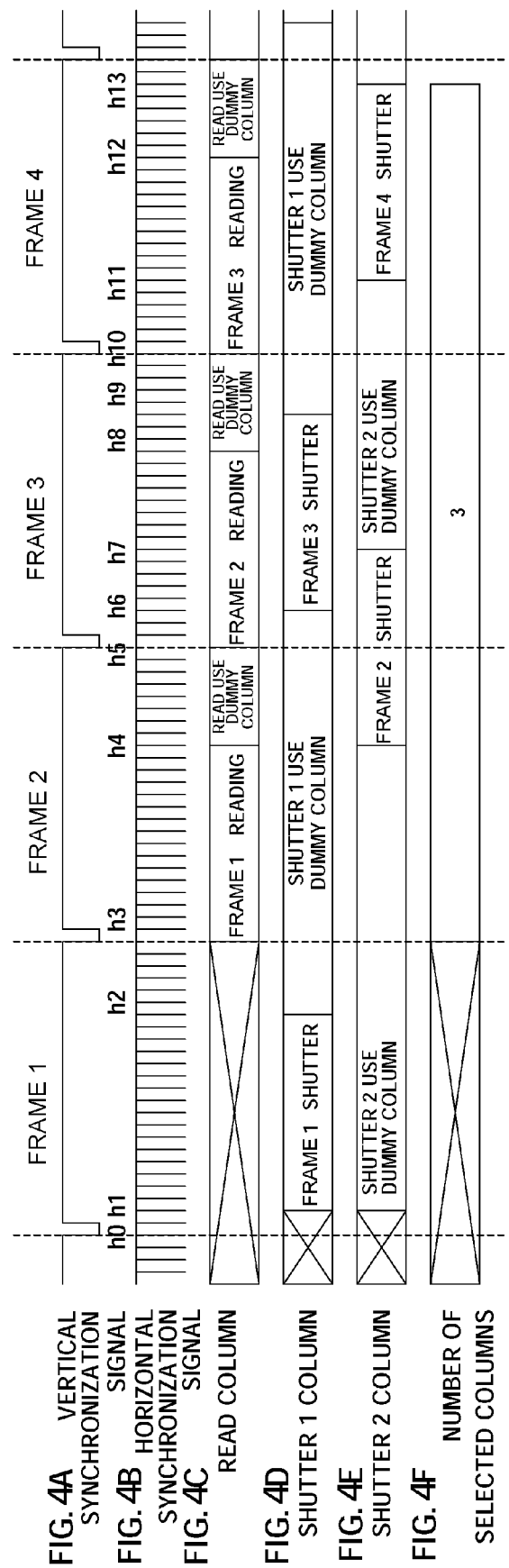

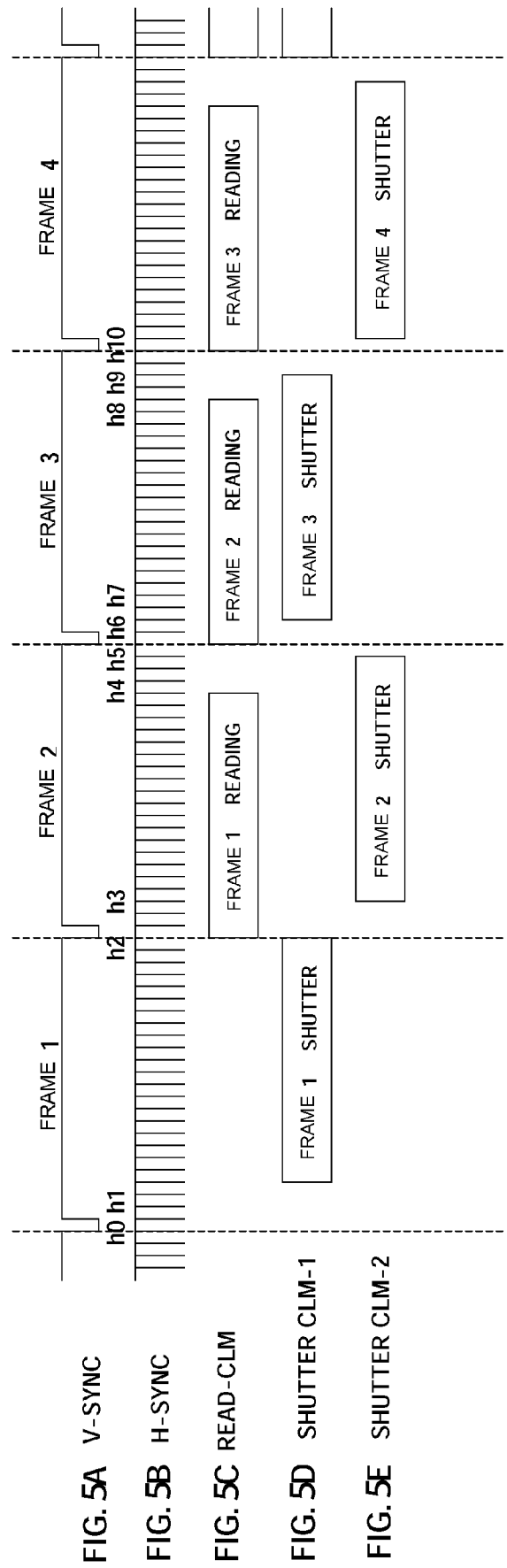

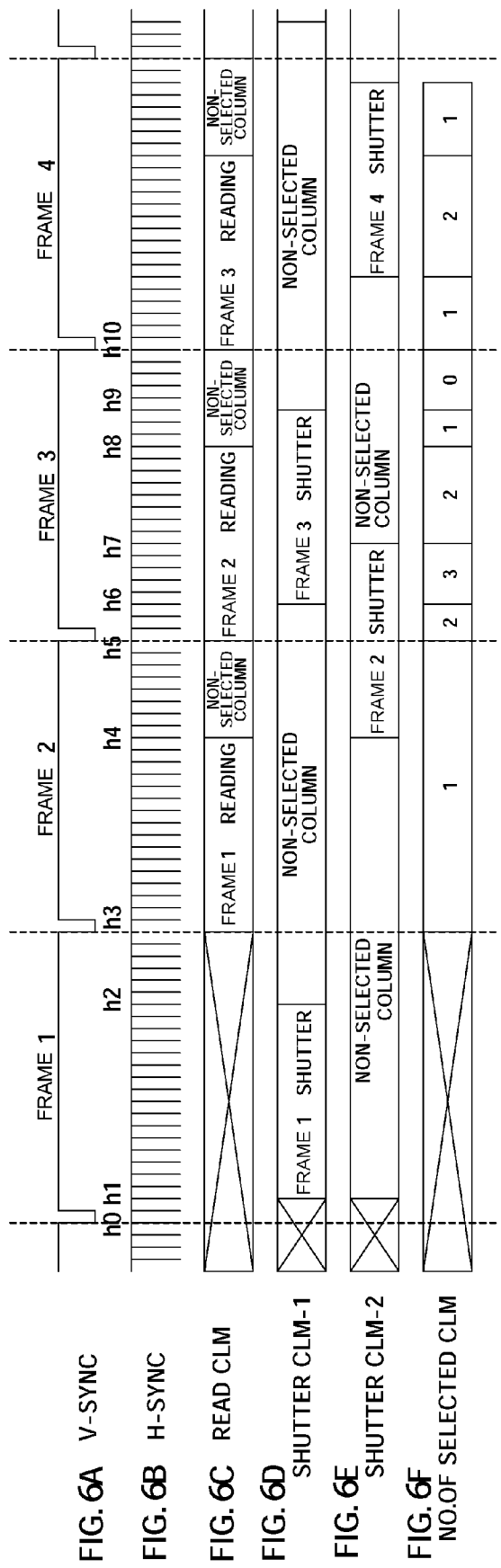

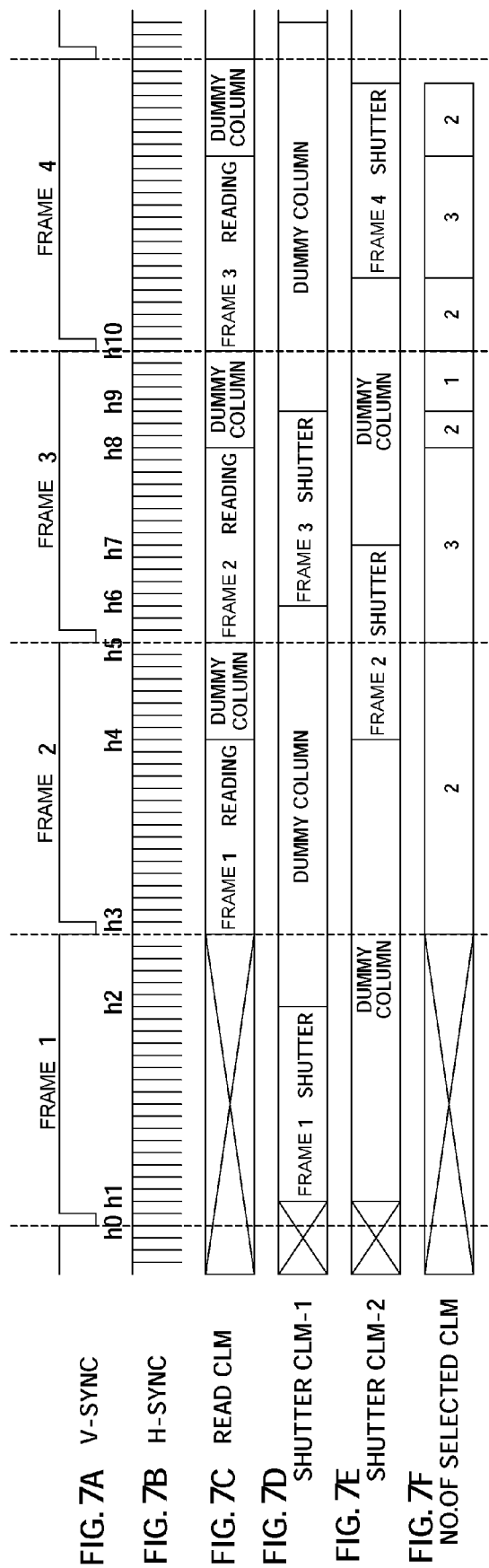

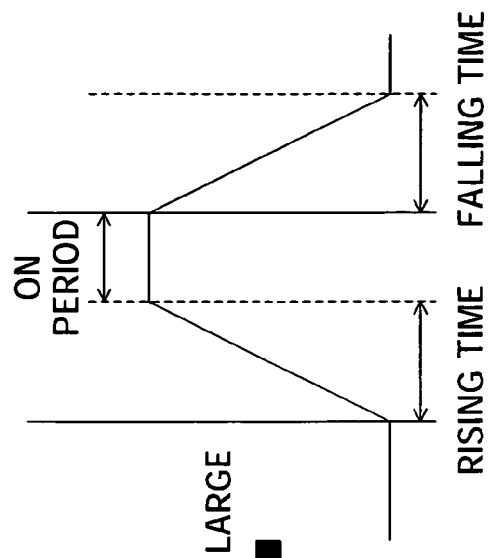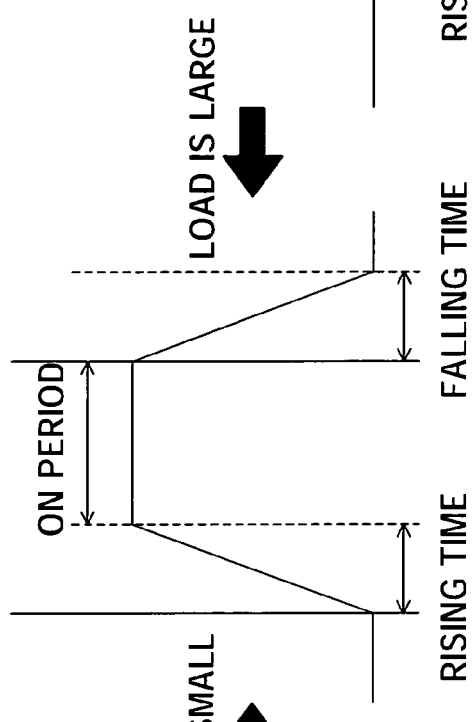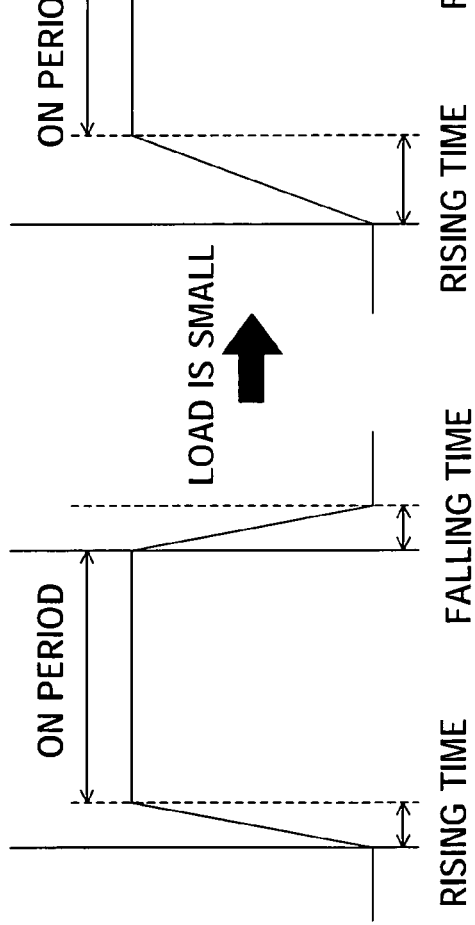

SOLID STATE IMAGING DEVICE AND METHOD FOR DRIVING SAME AND IMAGING APPARATUS

CROSS REFERENCES TO RELATED APPLICATIONS

The present invention contains subject matter related to Japanese Patent Application No. 2005-065605 filed in the Japan Patent Office on Mar. 9, 2005, the entire contents of which being incorporated herein by reference.

BACKGROUND OF THE INVENTION

1. Field of Invention

The present invention relates to a solid state imaging device and a method for driving the same, more particularly relates to a technique for stabilizing loads applied upon circuits generating signals for transferring or discarding charges stored in opto-electro converting elements in a solid state imaging device. The present invention further relates to an imaging apparatus using the solid state imaging device.

2. Description of the Art

For example, Japanese Patent Publication (A) No. 2001-511628 discloses an imaging apparatus using a CMOS image sensor of a column unit reading type which simultaneously selects one read column and a plurality of shutter columns and transfers or discards charges stored in photodiodes (opto-electro converting elements) in the selected columns so as to realize a focal plane shutter.

In the imaging apparatus using this type of CMOS image sensor, when it is necessary to make a frame rate constant, a dummy period during which signals are not read from the actual effective pixels becomes necessary. To make the exposure times of the effective pixels constant, during the dummy period, columns including effective pixels cannot be selected as a pixel signal reading column (read columns) or shutter columns.

Further, when there is a plurality of shutter columns as well, columns including effective pixels cannot be selected as shutter columns in the dummy period during which it is not necessary operate the shutter in a camera device and block light.

Hitherto, no suitable measure has been taken for columns selected during the dummy period. The number of selected columns could change during operation as well. If the number of selected columns changes, the load applied upon the circuit for generating the signals for transferring or discarding charges stored in the photodiodes changes. Therefore, the reference potential level fluctuates or the charge transfer efficiency varies. This becomes a cause of an afterimage.

SUMMARY OF THE INVENTION

It is therefore desirable to provide a solid state imaging device making loads applied upon reset signal lines and transfer signal lines of columns of pixels always constant with respect to each reading period so as to eliminate variations (unevenness) in column units of the output signal level.

It is further desirable to provide a method for driving such a solid state imaging device.

It is still further desirable to provide an imaging apparatus using such a solid state imaging device.

The present invention is based on the idea of providing different dummy columns for all of the pixel signal reading columns (read columns) and columns for shielding light (shutter columns) outside of the effective pixel region of the solid state imaging device and making the number of selected columns always constant so as to thereby obtain a constant reference potential level and charge transfer efficiency.

According to a first aspect of the present invention, there is provided a solid state imaging device comprising a pixel portion having a plurality of pixels arrayed two-dimensionally defined by columns and rows and converting optical signals to electric signals, the plurality of pixels arrayed in an effective pixel portion and a dummy pixel portion in the form of columns; a timing generator for generating address information for reading signals of pixels of the pixel portion and timing signals for reading; a column decoder for outputting line selection signals for selecting a certain plurality of lines of pixels in one frame period based on the address information output from the timing generator; a column selection circuit for generating transfer signals and reset signals used for control for reading signals of pixels in the column portions of the pixel portion by the plurality of line selection signals output from the column decoder based on the timing signals and selecting column portions of pixels in an effective portion and a dummy portion of the pixel portion; and a transfer circuit for reading signals of corresponding pixels based on the transfer signals and reset signals output from the column selection circuit, then transferring signals of read pixels by the row signal lines.

According to a second aspect of the present invention, there is provided a solid state imaging device having a pixel portion having a plurality of pixels arrayed two-dimensionally defined by columns and rows and converting optical signals to electric signals, wherein the plurality of pixels include effective pixels and dummy pixels, exactly a certain number of pixel rows in which the effective pixels and the dummy pixels are arrayed in a column state being selected in one frame period, that number obtained by adding columns for instructing the reading end of the pixel signals and the pixel signal reading columns, and the pixel signals being transferred from the columns of effective pixels of the selected columns.

According to a third aspect of the present invention, there is provided a method of driving a solid state imaging device having a pixel portion having a plurality of pixels arrayed two-dimensionally defined by columns and rows and converting optical signals to electric signals, the plurality of pixels arrayed in an effective pixel portion and a dummy pixel portion in the form of columns, comprising a step of generating address information for reading signals of the pixels of the pixel portion and timing signals for reading; a step of generating line selection signals for selecting a certain plurality of lines of pixels in one frame period based on the address information; a step of generating transfer signals and reset signals used for control for reading signals of pixels in the column portions of the pixel portion by the plurality of line selection signals based on the timing signals and selecting column portions of pixels in an effective portion and a dummy portion of the pixel portion; and a step of reading signals of corresponding pixels based on the transfer signals and reset signals output, then transferring signals of read pixels by the row signal lines.

According to a fourth aspect of the present invention, there is provided an imaging apparatus comprising a solid state imaging device having a pixel portion having a plurality of pixels arrayed two-dimensional state defined by columns and rows and converting optical signals to electric signals, the plurality of pixels arrayed in an effective pixel portion and a dummy pixel portion in the form of columns; an optical system for guiding incident light to the pixel portion; a timing generator for generating address information for selecting the pixels of the pixel portion and timing signals for reading the signals from the selected pixels; a column decoder for outputting line selection signals for selecting a certain plurality of lines of pixels in one frame period based on the address information output from the timing generator; a column selection circuit for generating transfer signals and reset signals used for control for reading signals of pixels in the column portions of the pixel portion by the plurality of line selection signals output from the column decoder based on the timing signals and selecting column portions of pixels in an effective portion and a dummy portion of the pixel portion; a transfer circuit for reading signals of corresponding pixels based on the transfer signals and reset signals output from the column selection circuit, then transferring signals of read pixels by the row signal lines; and a signal processing circuit for processing the pixel signals transferred by the transfer circuit as imaging signals.

Summarizing the effects of the invention, in the solid state imaging device of the present invention, voltage conversion of charges stored in the photodiodes (opto-electro converting elements) can be carried out with a stable reference voltage and charge transfer efficiency, so the variation (unevenness) and afterimage in unit of columns of the output signal level are not generated. Further, there are the same number of dummy columns as the number of the pixel signal reading (read) columns and columns for shielding against incidence of the light upon the pixels (for example shutter columns), therefore the ratio of selection of each dummy column is reduced, and pixel deterioration of the dummy columns can be suppressed. The imaging apparatus of the present invention using the above solid state imaging device provides high quality images.

BRIEF DESCRIPTION OF THE DRAWINGS

These and other objects and features of the present invention will become clearer from the following description of the preferred embodiments given with reference to the attached drawings, wherein:

FIGS. 4A to 4F are timing charts for explaining the operation of the pixel selection circuit shown in FIG. 3;

FIGS. 5A to 5E are timing charts for explaining the operation of another solid state imaging device;

FIGS. 6A to 6F are timing charts for explaining the operation of the other solid state imaging device;

FIGS. 7A to 7F are timing charts for explaining the operation of the other solid state imaging device; and FIGS. 8A to 8C are waveform diagrams for explaining the operation of the other solid state imaging devices shown in FIGS. 5A to 5E to FIGS. 7A to 7F.

DESCRIPTION OF THE PREFERRED EMBODIMENTS

Below, preferred embodiments will be described with reference to the accompanying drawings.

Figure 1:
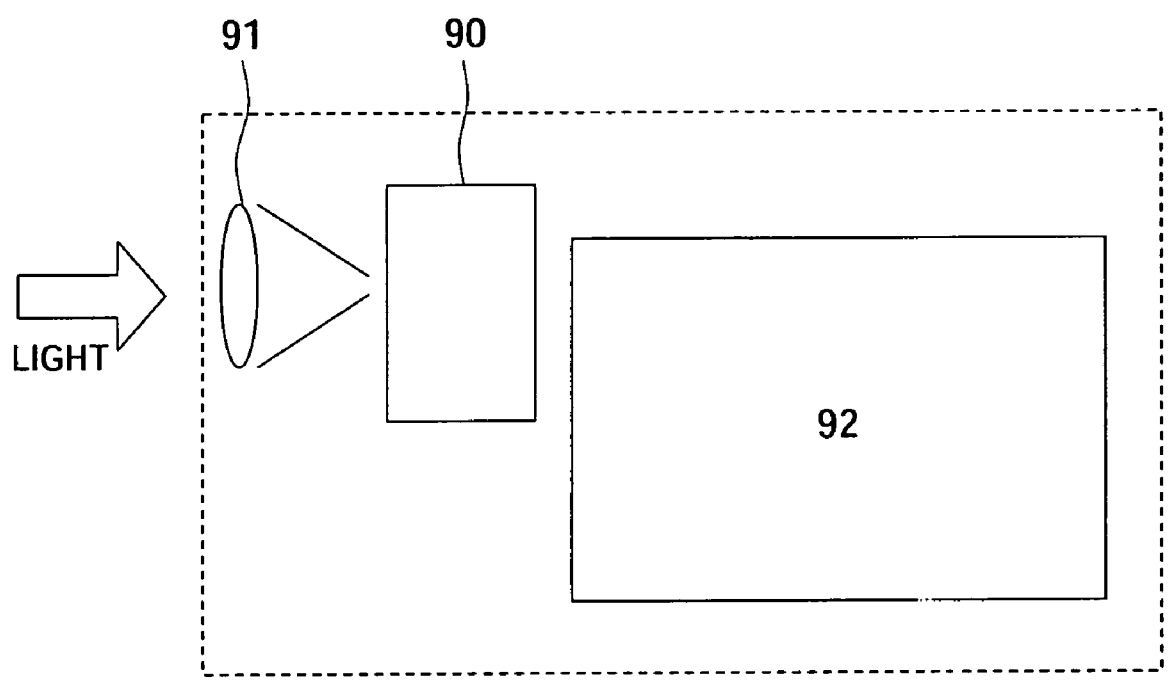
FIG. 1 is a view of the configuration of a camera device as an example of an imaging apparatus of the present invention.

FIG. 1 is a schematic view of an imaging apparatus using a solid state imaging device according to an embodiment of the present invention. The imaging apparatus, for example, a camera device 9, has an optical lens system 91, a solid state imaging device 90, and an image processing unit 92. The lens system 91 has for example a combination of various types of lenses having a zoom function, an aperture, etc. In FIG. 1, the subject to be shot is at the left front of the lens system 91. An image of the subject strikes the solid state imaging device 90 through the lens system 91. Details of the solid state imaging device 90 will be explained later, but provision is made of a plurality of photodiodes each composing a pixel and arrayed two-dimensional state defined by columns and rows. Each photodiode generates an electric signal in accordance with the light of the image of the subject passed through the lens system 91. The image processing unit 92 receives as input the electric signals generated in accordance with the image of the subject in the plurality of pixels of the solid state imaging device 90, performs predetermined signal processing, displays an image of the subject on a not shown display unit, for example, a liquid crystal display unit, and stores the image of the subject in a detachable storage means such as a memory stick in response to an instruction of a user. The camera device 9 is provided with various types of operating means, for example, a shutter, a zoom button, and an automatic focus adjustment button. The image processing unit 92 performs processing in response to these operations. For example, when zoom is instructed by the zoom button, the lens system 91 zooms in on the subject. For example, when the shutter is depressed, an image the same as the image generated in the solid state imaging device 90 and displayed on the display unit is stored in for example the detachable storage means.

Figure 2:
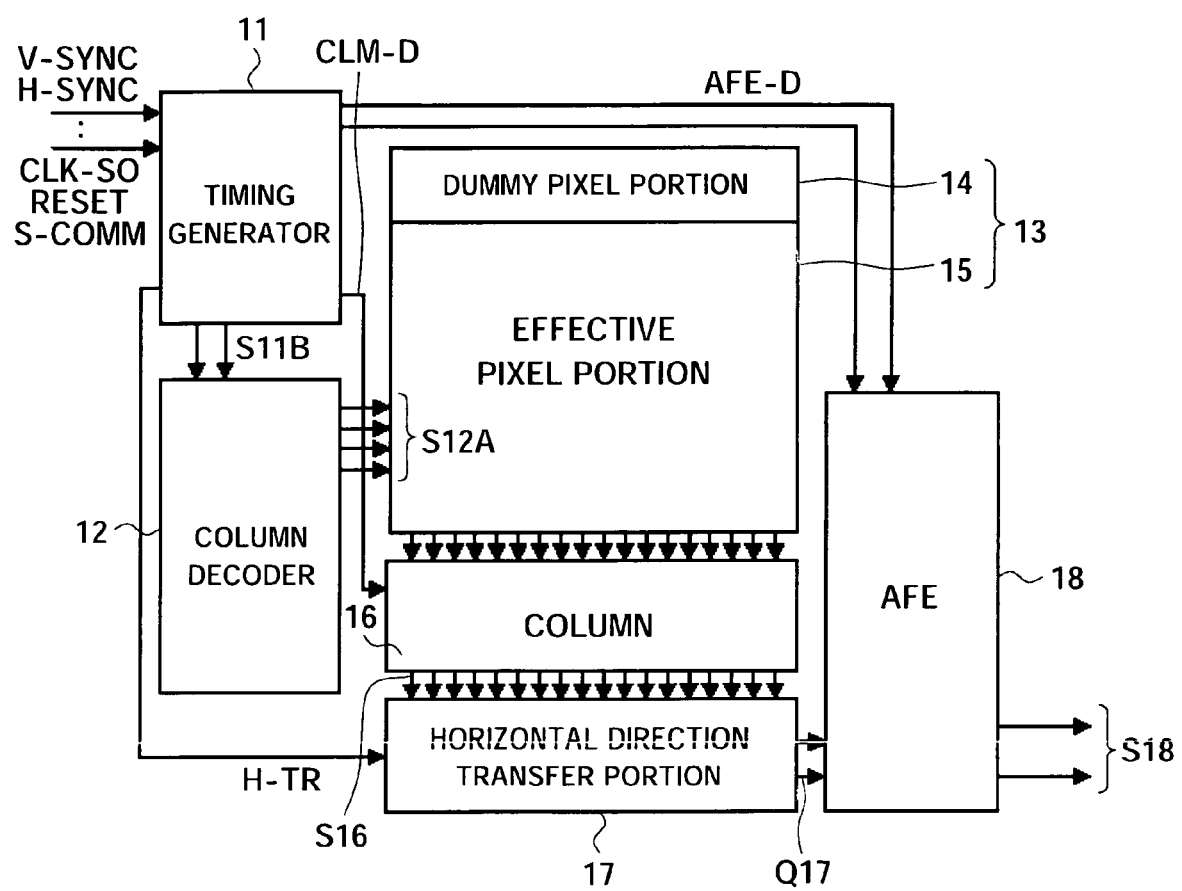
FIG. 2 is a block diagram of a solid state imaging device according to an embodiment of the present invention.

FIG. 2 is a schematic block diagram of a solid state imaging device 10 of a column correlated double sampling (CDS) type CMOS image sensor according to an embodiment of the present invention exemplified as the solid state imaging device 90 in FIG. 1. The solid state imaging device 10 is configured by a timing generator 11, a column decoder 12, a dummy pixel portion 14 and an effective pixel portion 15 composing a pixel portion 13, a column selection unit 16, a horizontal direction transfer portion 17, and an analog front end (AFE) circuit 18.

A vertical synchronization signal V-SYNC, a horizontal synchronization signal H-SYNC, a sensor drive use clock CLK-SD, a sensor reset use signal RESET, a serial communication signal S-COMM, etc. are input from the outside of the solid state imaging device 10 to the timing generator 11. The timing generator 11 generates various types of timing signals for driving the column decoder portion 12, the horizontal direction transfer portion 17, the column selection unit 16, and the AFE circuit 18 by these input signals. The column decoder portion 12 receives column information S11B from the timing generator 11 and outputs a pixel drive signal S12A for driving the pixels connected to the column of the effective pixel portion 15 designated by the received column information S11B to the effective pixel portion 15. The pixels of the effective pixel portion 15 are arrayed two-dimensionally defined by columns and rows as partially illustrated in FIG. 3. The pixel portion 13 is configured by the dummy pixel portion 14 and the effective pixel portion 15. The unit cells comprising those pixels have the same circuit configurations. However, it is not necessary to extract the pixel signals from the pixels of the dummy pixel portion 14. These are only used as load elements or load circuits for the circuit for selecting the pixel columns (column decoder). Therefore, they are configured so as to shield against light by a thin metal film of for example Al (aluminum) film so that the light will not strike.

This will be explained with reference to a configuration in which unit cells 35A of pixels are arranged in one column and one row of the effective pixel portion 15 of the pixel portion illustrated in FIG. 3. Each photodiode PD is connected at its anode to the ground and connected at its cathode to a source of an NMOS transistor Tr1 configuring a transfer (TR) gate. The gate of the NMOS transistor Tr1 is connected to a transfer gate signal line TR, and a drain is connected to a floating diffusion FD. The source of a reset use NMOS transistor Tr2 is connected to the floating diffusion FD, the gate is connected to a reset signal line RST, and the drain is connected to the line of a reference potential VSEL. The gate of an amplification use NMOS transistor Tr3 is connected to the floating diffusion FD, the drain is connected to the line of the reference potential VSEL, and the source is connected to a vertical (column) signal line. The unit cells of the pixels operate as follows: The transistors Tr1, Tr2, and Tr3 become an ON state when both of the reset signal RST and the transfer gate signal TR are at an "H (high)" level. The photodiode PD is set at the reference potential VSEL, that is, the pixel is reset. Then, the reset signal RST and the transfer gate signal TR become a "L (low)" level. Thereafter, pulses of "H" level of the reset reading signal (P phase) (hereinafter, referred to as the reset signal RST) are supplied to the gate of the NMOS transistor Tr2, the NMOS transistor Tr2 becomes an ON state, a voltage from the reference power supply SEL is applied to the floating diffusion FD via the drain-source, and the floating diffusion FD is reset. The reset voltage is supplied to the gate of the amplification NMOS transistor Tr3, the amplification NMOS transistor Tr3 operates as a source follower circuit, then the reset voltage is amplified and derived from the vertical signal line and transferred to the column portion 16. The transfer use NMOS transistor TR1 is in an OFF state from this reset period to a start of the next reading period (D phase). Optical charges are stored in the photodiodes PD in accordance with the amount of light and the time. Next, when the voltage of the "H" level (pixel reading (D phase)) of the transfer signal TR is supplied, the NMOS transistor Tr1 becomes the ON state and transfers the charge stored in the photodiode PD to the floating diffusion FD. The potential of the floating diffusion FD changes by the amount of charge. The amount of change is supplied to the gate of the amplification use NMOS transistor Tr3, amplified, then output to the vertical signal or (row) line, and further transferred to the column portion 16. Then, as explained above, pulses of the reset signal RST and the transfer signal TR of "H" level are simultaneously supplied, the NMOS transistor Tr1, the NMOS transistor Tr2, and the NMOS transistor Tr3 become the ON state, and the pixels are reset (electron shutter in the camera device). Thereafter, a difference of signals output from the vertical signal line between the reset period and the transfer period becomes an image output signal, and is processed in the later circuits such as the AFE 18 and image signal processing unit 92.

The column portion 16 samples and holds potential levels P-FD output from the floating diffusions FD of the pixels of the designated columns of the pixel portion by the column drive signal CLM-D output from the timing generator 11. The horizontal direction transfer portion 17 sequentially transfers floating diffusion (FD) potential levels (charges) (G) of pixels sampled and held at the column portion 16 to the AFE circuit 18 by the horizontal direction transfer signal H-TR output from the timing generator 11. The AFE circuit 18 converts charges (H) output from the horizontal direction transfer portion 17 to voltage at the amplification circuit by the AFE drive signal AFE-D output from the timing generator 11 and amplifies and outputs the same to the outside of the solid state imaging device.

Figure 3:
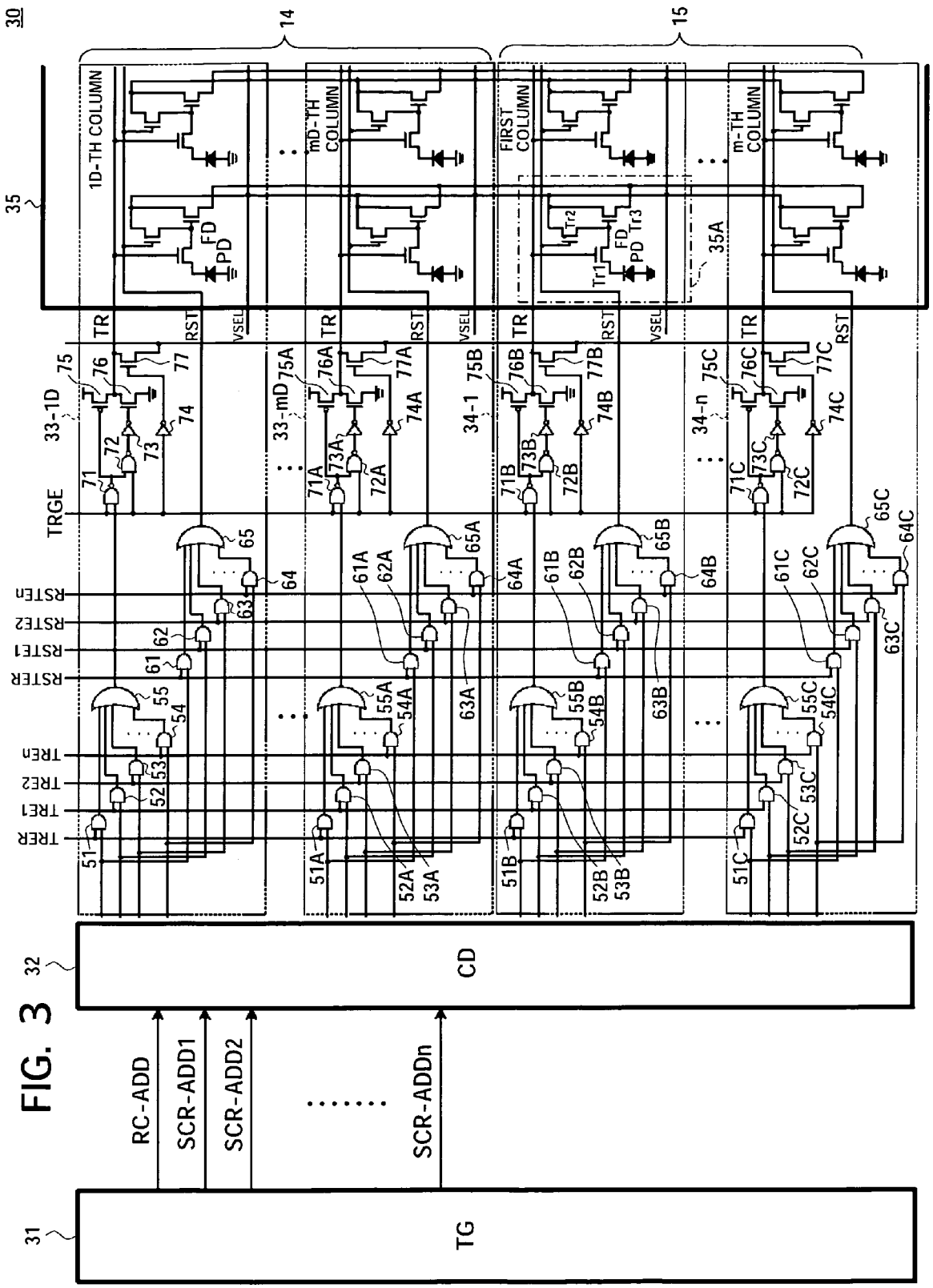
FIG. 3 is a diagram of the circuit configuration of a pixel column selection circuit of a solid state imaging device of the embodiment of the present invention shown in FIG. 2.

FIG. 3 shows a pixel drive circuit 30 on the periphery of the pixel portion circuit of the solid state imaging device 10. The pixel drive circuit 30 is configured by a timing generator 31, a column decoder 32, dummy pixel use column selection circuits 33-1D to 33-mD including pixels, and effective pixel use column selection circuits 34-1 to 34-m. The timing generator 31 generates read use column address information RC-ADD and shutter use column address information SCR-ADD1 to SCR-ADDn and independently or simultaneously generates the dummy pixel use selection signal and the effective pixel column selection signal corresponding to these address information. The column decoder 32 is supplied with and decodes column address information C-ADD output from the timing generator 31. As a result of decoding, a read use output signal R-OUT, a shutter 1 use output signal S-OUT1, a shutter 2 output signal S-OUT2, . . . , and a shutter n use output signal S-OUTn are output with respect to each pixel column. Note that the number of pixel columns selected from the column decoder 32 is constant in the frame period. The dummy pixel use column selection circuits 33-1D to 33-mD and the effective pixel use column selection circuits 34-1 to 34-m have the same circuit configuration, but as explained above, the dummy pixel use column selection circuits are configured so as to block light by for example metal film, so signals of a black level are detected. However, these detected signals are not actually used, therefore it is not necessary to perform the signal processing in the latter circuits such as the AFE 18 and image signal processing unit 92. Further, by making the number of selected columns constant by providing the same number of these dummy pixel columns (mD) as the number of the read columns and shutter columns or more, the reference potential level is stabilized, and the charge transfer efficiency becomes constant.

First, an explanation will be given of the configuration of the path of the TR (transfer) signals supplied to the pixels. The dummy pixel use column selection circuits 33-1D to 33-mD are connected in read use transfer enable (TRE) lines to first inputs of AND circuits 51, connected in read use outputs to the other inputs, and connected in outputs to first inputs of OR circuits 55. Shutter use first transfer enable (TRE) lines are connected to first inputs of AND circuits 52, shutter 1 use outputs output from the column decoder 32 are connected to the other inputs, and the outputs are connected to second inputs of the OR circuits 55. Shutter use second transfer enable (TRE) lines are connected to first inputs of AND circuits 53, shutter 2 use outputs output from the column decoder 32 are connected to the other inputs, and the outputs are connected to third inputs of the OR circuits 55. Below, in the same way, this operation is repeated up to n, so shutter use n-th transfer enable (TRE) lines are connected to first inputs of AND circuits 54, shutter n use outputs output from the column decoder 32 are connected to the other inputs, and the outputs are connected to the (n+1)th inputs of the OR circuits 55. The outputs of the OR circuits 55 are connected to first inputs of NAND circuits 71. The transfer gate enable (TRGE) signal lines are connected to the other inputs of the NAND circuits 71 and first inputs of NAND circuits 72, and the outputs of the NAND circuits 71 are connected to the other inputs of the NAND circuits 72 and gates of PMOS transistors Tr75. The outputs of the NAND circuits 72 are connected to the inputs of inverters (INV) 73, and the outputs of these INV 73 are connected to the gates of NMOS transistors Tr76. Sources of the PMOS transistors Tr75 are connected to the power supply, and drains are connected to drains of the NMOS transistors Tr76 and drains of NMOS transistors Tr77. Sources of the NMOS transistors Tr76 are connected to the ground, whereby a CMOS inverter circuit is configured by the PMOS transistor Tr75 and the NMOS transistor Tr76. The transfer gate enable (TRGE) lines are connected to the inputs of the INV 74, the outputs are connected to the gates of the NMOS transistors Tr77, and the sources of the NMOS transistors Tr77 are connected to the power supply of −1V. Commonly connected drains of the PMOS transistors Tr75 and the NMOS transistors Tr76 are connected to the TR signal lines for driving columns of dummy pixels.

Next, the circuit configuration of path of the RST (reset) signals supplied to the pixel portion will be explained. The read use reset enable (RSTE) lines are connected to first inputs of the AND circuits 61, the read use outputs from the column decoder 32 are connected to the other inputs, and the outputs are connected to the first inputs of the OR circuits 65. The shutter 1 use reset enable (RSTE) lines are connected to first inputs of the AND circuits 62, the shutter 1 use outputs output from the column decoder 32 are connected to the other inputs, and the outputs are connected to the second inputs of the OR circuits 65. The shutter 2 use reset enable (RSTE) lines are connected to first inputs of the AND circuits 63, the shutter 2 use outputs output from the column decoder 32 are connected to the other inputs, and the outputs are connected to the third inputs of the OR circuits 65. Below, in the same way, this operation is repeated up to n, whereby the shutter n use reset enable (RSTE) lines are connected to first inputs of the AND circuits 64, the shutter n use outputs output from the column decoder 32 are connected to the other inputs, and the outputs are connected to the (n+1)th inputs of the OR circuits 65. The outputs of the OR circuits 65 are connected to the reset (RST) lines of the dummy pixel portions of the pixel portions to supply the reset signals RST.

This dummy pixel use selection circuit is configured to repeat this operation for mD columns. "A" is added to each circuit element of the dummy pixel column drive circuit of the mD-th column after its notation. As illustrated in FIG. 3, the pixel portion 13 includes the effective pixel portion 15 other than the dummy pixel portion 14. The effective pixel use column selection circuits 34-1 to 34-n are formed there. When the image signal is extracted, this effective pixel portion 15 is driven. Also the effective pixel use column selection circuits 34-1 to 34-n have the same configuration as that of the dummy pixel use column selection circuits 33-1D to 33-mD explained above, therefore for elements of the column drive circuit of the effective pixels have a notation "B" added to the first row and a notation "C" added to the mD-th column after notations of the elements. Further, the specific circuit configuration is the same, therefore the description thereof will be omitted.

The dummy pixel use column selection circuits of the pixel drive circuit 30 of FIG. 3 are configured so as to select the dummy pixels of the 1D-th column to the mD-th column, and the read use transfer enable (TRE) signal lines are connected to first inputs of mD AND circuits of AND51, ..., 51A in parallel. For this reason, mD impedances of inputs of the AND circuits 51, ..., 51A are connected in parallel in this configuration. As a result, for example the "H" level of a read use output signal of an input signal is supplied to the AND circuit 51 and only another two columns. The other columns are made the "L" level. Simultaneously with that, when the read use transfer enable (TRE) signals are supplied from the timing generator 11 to other inputs of all AND circuits (51A, ..., 51B, ..., 51C), the total impedance is determined by the input impedances of the three ON operating AND circuits and the remaining OFF operating AND circuits and their interconnect capacitances, and a time constant corresponding to that is determined. Further, the input load impedance changes according to the number of the ON operating AND circuits. The time constant changes along with this. In some cases, a rising time of the input signal becomes long, and a rising waveform of the input and a trailing waveform of the output deteriorate along with this. In the same way as the AND circuits 51, ..., and 51A, corresponding to the AND circuits 52, ..., 52A, ..., and AND circuits 54, ..., 54A, the shutter 1 use transfer enable (TRE) signal line, the shutter 2 use transfer enable (TRE) line, ..., and the shutter n use transfer enable (TRE) signal line are sequentially connected from the timing generator 11 in parallel. The waveform responses thereof are also the same. Further, the effective pixel use column selection circuit of the pixel drive circuit 30 is configured so as to select the effective pixels of the first column to the m-th column. The circuit configuration of this effective pixel use column selection circuit is the same as that of the dummy pixel use column selection circuit. The AND circuits 51B, ..., 51C, the AND circuits 52B, ..., 52C, ..., and the AND circuits 54B, ..., 54C have the read use transfer enable (TRE) signal line, the shutter 1 use transfer enable (TRE) signal line, the shutter 2 use transfer enable (TRE) signal line, ..., and the shutter n use transfer enable (TRE) signal line sequentially connected to them in parallel. As a result, in the same way as the dummy pixel use column selection circuits explained above, the signal lines from the timing generator 11 are connected in parallel to the inputs of the AND circuits, the input load changes in accordance with the number of "H" levels of the read use output signal, the shutter 1 use output signal, and the shutter n use output signal input to the AND circuits, and the rising time and the falling time change. Further, in some cases, the rising time and the falling time become long, or the period of the "H" level of the transfer signal TR and the reset signal RST becomes short. This exerts an influence upon the pixel drive.

In this way, in the dummy pixel use column selection circuits and the effective pixel use column selection circuits, when the number of the operating AND circuits fluctuates in for example one frame period, the input (of load) impedance fluctuates along with that, and the rising time and falling time of AND circuit become different. Accordingly, by making the number of the column selection lines constant during for example one frame period, the change of the waveform response can be eliminated.

An explanation will be given of the operation of the pixel drive circuit 30 shown in FIG. 3 with reference to FIG. 4. First, the overall operation of the pixel drive circuit 30 will be explained, then a specific example will be explained after that. In the pixel drive circuit 30 shown in FIG. 3, the read use column address information and the shutter use address information 1, 2, ..., n of for example 10 bits are output from the timing generator 31 and input to the column decoder 32. The read use output signal, the shutter 1 use output, the shutter 2 use output, and the shutter n use output signal are output for each horizontal line in each frame period at the column decoder 32. Then, each horizontal period column decoder 32 outputs the column selection signals of the read use output, the shutter 1 use output, the shutter 2, ..., shutter n outputs. In this way, these signals output from the column decoder 32 are made not only able to select the effective pixel columns, but also able to freely select the read use dummy column, the shutter 1 use dummy column, the shutter 2 use dummy column, ..., and the shutter n use dummy column in one frame period. By outputting the address information of the timing generator 31 to the column decoder 32 in the frame period, the decoding is carried out at the column decoder 32, and as a result, a plurality of columns are simultaneously selected, for example the frame reading line or read use dummy line is selected with respect to the read column, the frame shutter column (line) or shutter 1 use dummy line is selected with respect to the shutter 1 column, and the frame shutter line or shutter 2 use dummy line is selected with respect to the shutter 2 column. In this way, when selecting the dummy columns, the pixel columns of effective pixels are selected simultaneously with this, and the frame read out operation, the shutter operation of the shutter (1, 2, . . . , n) use dummy columns, and the shutter operation of the other frames are simultaneously carried out. Namely, for example three pixel (column) lines are simultaneously selected as explained above in a certain horizontal period from the column decoder 32 (see FIG. 4). Accordingly, for example, the number of signals supplied to inputs of the AND circuits 51, 51A, 51B, and 51C of the column selection circuit is always constant, a value obtained by summing impedances of inputs of circuits, particularly input capacitances and floating capacitances, becomes the same, and the input impedances applied to the circuits become constant. As a result, even when positions of column lines to which operation signals output from the column decoder 32 are output are different, the number of their operation lines is constant, therefore the total impedance of the input circuit does not change. Accordingly, the rising and falling waveforms of the column selection circuit do not change even when the line is switched.

Next, taking as an example the 1D-th column of the dummy pixels, a specific explanation will be given of the operation of the circuit. The other effective pixel use column selection circuits and dummy pixel use column selection circuits have the same circuit configuration, therefore a detailed explanation of their operations will be omitted. First, an explanation will be given of the operation of the dummy pixel use column selection circuit outputting the transfer signal TR. The read use output signal, the shutter 1 use output signal, the shutter 2 use output signal, . . . , and the shutter n use output signal are output from the column decoder 32. These output signals are supplied to first inputs of the AND circuits 51, 52, . . . , and 54. Further, the read use transfer enable (TRE) signal is input to the other input of the AND circuit 51, and the shutter 1 use transfer enable (TRE) signal, . . . , and the shutter n use transfer enable (TRE) signal are input to the other input of the AND circuit 52. As a result, when there is even one "H" level of input signals in each AND circuit, the output of the OR circuit 55 in the next stage becomes the "H" level. Further, when all inputs output from the column decoder 32 are at the "L" level, the output of the OR circuit 55 becomes the "L" level. When the output of the OR circuit 55 is at the "H" level, in the "H" level period of the transfer gate enable (TRGE) signal, the PMOS transistor Tr75 becomes the ON operation state, and the NMOS transistor Tr76 becomes the OFF operation state. Further, this NMOS transistor Tr77 is in the OFF operation state in this period. During this period, the signal of the "H" level is output to the transfer (TR) line. When the transfer gate enable (TRGE) signal becomes the "L" level, the PMOS transistor Tr75 and the NMOS transistor Tr76 become the OFF operation state. During this period, the NMOS transistor Tr77 becomes the ON operation state and supplies −1V to the transfer (TR) line. When the output of the OR circuit 55 is at the "L" level, during the "H" level period of the TRGE signal, the PMOS transistor Tr75 becomes the OFF operation state, and the NMOS transistor Tr76 becomes the ON operation state. Further, the NMOS transistor Tr77 is in the OFF operation state during this period. During this period, the signal of the "L" level is output to the transfer (TR) line. When the TRGE signal becomes the "L" level, the PMOS transistor Tr75 and the NMOS transistor Tr76 become the OFF operation state. During this period, the NMOS transistor Tr77 becomes the ON operation state and outputs −1V to the transfer (TR) line.

Next, an explanation will be given of the dummy pixel use column selection circuit outputting the reset signal RST. The read use output signal, the shutter 1 use output signal, the shutter 2 use output signal, . . . , and the shutter n use output signal are output from the column decoder 32. These output signals are supplied to first inputs of the AND circuits 61, 62, . . . , and 64. Further, the read use reset enable (RSTE) signal is output to the other input of the AND circuit 61, the shutter 1 use reset enable (RSTE) signal is input to the other input of the AND circuit 62, . . . , and the shutter n use reset enable (RSTE) signal is input to the other input of the AND circuit 64. As a result, in response to the timing signal from the timing generator 11, when there is even one "H" level of input signal in each AND circuit, the output of the OR circuit 65 in the next stage becomes the "H" level, and the "H" level signal is output to the reset (RST) line. Further, when all inputs output from the column decoder 32 are at the "L" level, the output of the OR circuit 65 becomes the "L" level, and the "L" level signal is output to the reset (RST) line.

Next, an explanation will be given of a specific example with reference to FIGS. 4A to 4F. FIG. 4A shows a vertical synchronization signal, and FIG. 4B shows a horizontal synchronization signal. Frame 1, frame 2, frame 3, frame 4, . . . are shown using the vertical synchronization signal as the standard. The horizontal synchronization signal is shown in synchronization with the vertical synchronization signal in each frame. During the frame periods, the column decoder outputs the transfer signals TR and the reset signal lines RST for selecting the dummy pixel columns and the effective pixel columns of the pixel portion.

The timing generator 31 outputs the for example 10 bits of read use column address information and shutter use column address information 1, 2 ( . . . , n) in synchronization with the horizontal synchronization signals in the frame periods and inputs them to the column decoder 32. Then, in synchronization with the horizontal synchronization signals, the column decoder 32 outputs signals selected from among column selection signals of the read use output, the shutter 1 use output, and the shutter 2 ( . . . , n) use outputs. As a result, in the period of horizontal synchronizations h0 to h1, the read use outputs, the shutter 1 use outputs, and the shutter 2 use outputs are at the "L" level, therefore, even when signals of the read use transfer enable (TRE) output from the timing generator 11 are input to the AND circuits 51 (51A, 51B, 51C), 52 (52A, 52B, 52C), . . . , and 54 (54A, 54B, 54C), the outputs become the "L" level. As a result, the outputs of the OR circuits 55 become the "L" level. When the outputs of the OR circuits 55 are at the "L" level, if the transfer enable (TRGE) signals of the "H" level are input, the PMOS transistors Tr75 become the OFF operation state, and the NMOS transistors Tr76 become the ON operation state. Then, the drains of the NMOS transistors Tr76 become the "L" level, and the transfer signals TR are set at the "L" level. At this time, the outputs of the inverters 74 become the "L" level, and the NMOS transistors Tr77 have become the OFF state. When the transfer gate enable (TRGE) signals become the "L" level, the NMOS transistors Tr76 are in the OFF state, both of the PMOS transistors Tr75 and the NMOS transistors Tr76 configuring the CMOS are in the OFF state, and their outputs become the floating state. Further, the NMOS transistors Tr77 become the ON state and become conductive, so the transfer (TR) signal lines are set at −1V. As a result, the transistors Tr1 configuring the pixel units become the OFF state.

Further, in the same way, signals of the "L" level are input to first inputs of the AND circuits 61 (61A, 61B, 61C), 62 (62A, 62B, 62C), . . . , and 64 (64A, 64B, 64C), and timing pulses for the read use reset enable (RSTE) signals, the shutter 1 use reset enable (RSTE) signals, the shutter 2 use reset enable (RSTE) signals, . . . , and the shutter n use reset enable (RSTE) signals are input to their other inputs. As a result, the outputs of the OR circuits 65 become the "L" level, and the reset signals RST of the 1D-th column to the 2D-th column (, . . . , mD-th column) of the dummy pixels and the first columns to the second columns (, . . . , the m-th column) of the effective pixels become the "L" level. As a result, the transistors Tr2 configuring the pixel units become the OFF state.

Next, in the same way as the operation explained above, in the horizontal synchronization h1 to h2 period, the read use column address information and the shutter use column address information 1 and 2 of the timing generator 31 are supplied to the column decoder 32. As a result of the decoding, the read column is not selected. In the shutter 1 column, the effective pixel use column selection circuits 34-1 to 34-n are selected and the shutter operation of the frame 1 is carried out, and in the shutter 2 column, the shutter 2 use dummy column, for example the dummy pixel use column selection circuit 33-2D is selected and the shutter operation is carried out. During the horizontal synchronization h2 to h3 periods, the read column is not selected, and the shutter 2 column continuously selects the shutter 2 use dummy column. However, the shutter operation of the effective pixel columns of the frame 1 is interrupted in the shutter 1 columns, the dummy columns for the shutter 1 are selected, and the shutter operation is started. Namely, the read use column address information, the shutter use column address information 1, and the shutter use column address information 2 supplied from the timing generator 31 are decoded at the column decoder 32. When the time of h2 of the horizontal synchronization comes, the signal for selecting the line of the dummy pixel column provided with the dummy pixels outputting the line selection signal is output.

During the horizontal synchronization periods h3 to h4 for the start of the second frame, the frame read operation is carried out in the read columns. In this case, as explained above, the signals of the "H" level are supplied to the transfer (TR) lines, the NMOS transistors Tr1 become the ON operation state by that, charges stored in the photodiodes PD are transferred to the floating diffusions FD, and further the image signals are read out from the column signal lines via the NMOS transistors Tr3. Such an operation is repeated in the horizontal synchronization periods h3 to h4, so the number of selected columns is always constant. As a result, the input impedance obtained by summing impedances of the AND circuits (51, 51A, 51B, 51C), the AND circuits (52, 52A, 52B, 52C), . . . , and the AND circuits (54, 54A, 54B, 54C), and the AND circuits (61, 61A, 61B, 61C), the AND circuits (62, 62A, 62B, 62C), . . . , and the AND circuits (64, 64A, 64B, 64C) of the column selection circuits is constant, the time constants of the rising and falling of these AND circuits do not change, and the input/output waveforms thereof are constant.

Further, during the horizontal synchronization periods h4 to h5 of the frame 2, the reading of the frame 1 is interrupted in the read columns, and the read use dummy columns are selected. At this time, the shutter 1 use dummy column is continuously selected in the shutter 1 columns. On the other hand, columns of the effective pixels of the frame 2 are selected in the shutter 2 columns and the shutter operation is performed in each horizontal period. At this time, signals of "H" level are simultaneously supplied to the transfer (TR) signal lines and the reset (RST) signal lines, both of the NMOS transistors Tr1 and the NMOS transistors Tr2 configuring the pixel units of the effective pixels perform the ON operation, and pixels are reset. During this horizontal synchronizations h4 to h5, the number of selected columns is 3.

During the horizontal synchronization periods h5 to h6 of the frame 3, the read columns perform the read operation of the frame 2, the shutter 1 columns select the shutter 1 use dummy columns and perform the shutter operation of the effective pixels, and the shutter 2 columns select the pixel columns of the effective pixels of the frame 2 and continue the shutter operation. During the horizontal synchronization periods h5 to h6 as well, the pixel columns of the effective pixels are selected for reading the frame 2, the shutter 1 use dummy columns are selected in the shutter 1 columns, and further the pixel columns of the effective pixels of the frame 2 are selected also in the shutter 2 columns and the shutter operation is performed. From this, the number of selected columns is 3 even during the horizontal synchronization periods h5 to h6, the column selection number in each frame period is constant, the input impedance of the AND circuits of the column selection portions (circuits) of the pixel drive circuit is constant, and the input and output waveforms are constant along with that.

Below, in the same way, the operation is repeated in horizontal synchronization periods h6 to h7 of frame 3, . . . , frame 4, . . . . In FIG. 4, in frame periods of the frame 2, frame 3, frame 4, . . . , the number of selected columns is 3 and always constant even when the frame changes (FIG. 4(F)). As a result, the ON periods of the transistors Tr2 operating as the reset (RST) switches of the pixels and the transistors Tr1 operating as the transfer (TR) switches become constant. The ON period may be set first so as to satisfy the circuit characteristics by raising the drive capability of AND circuits explained above. Accordingly, by providing separate dummy columns in all read columns and shutter columns, the number of selected columns in frame periods can be always made constant. The three dummy columns (mD=3) in total comprised of the two dummy columns of the shutter when the number of shutter columns is two and the one read dummy column when the number of the read columns is one may be provided. The addresses of these dummy columns are designated by the address information of the timing generator 31 and decoded at the column decoder 32, whereby the dummy columns are horizontally synchronized and output. As a result, it is possible to stabilize the reference potential level and make the charge transfer efficiency constant, therefore unevenness in column units of the output signal level and afterimage are not generated. Further, by making the loads applied to the reset (RST) signal lines and the transfer (TR) signal lines of the columns always constant with respect to each reading period, unevenness in column unit of the output signal level can be eliminated. Further, since there are the same number of dummy columns as the number of read columns and shutter columns or more, the ratio of selection of each dummy column is reduced, and the pixel deterioration of dummy columns is suppressed.

Next, an explanation will be given of the results of comparison of the pixel drive circuits 30 of the solid state imaging devices shown in FIG. 2 to FIGS. 4A to 4F and other solid state imaging devices with reference to FIGS. 5A to 5E to FIGS. 8A to 8C. There are other solid state imaging devices generating the read use column address information, the shutter use column address information 1, and the shutter use column address information 2 from the timing generator 31 for the pixel drive circuits 30 illustrated in FIG. 3 and FIGS. 4A to 4F, but unable to freely set the selection lines by the column decoder 32. In a system of a solid state imaging device having two or more shutter columns shown in FIGS. 5A to 5E, sometimes the shutter column to be used changes for each frame. In FIGS. 5A to 5E, during the period of the frame 1, the pixel column has not yet been selected in the read columns, the shutter operation of the frame 1 is carried out up to the horizontal synchronization periods h1 to h2 in the shutter 1 columns, and the shutter 2 columns have not yet operated and the columns have not yet been selected. During the period of the frame 2, the read columns perform the read operation of the frame 1 in the horizontal synchronization periods h2 to h4, but the shutter 1 columns interrupt the shutter operation (blocking operation) of the frame 1. On the other hand, the shutter 2 columns perform the shutter operation of the frame 2 except for a few horizontal synchronization periods (h2 to h3, h5 to h6) of the start and end of the frame 2. Below, the same operation are carried out. In such a case as well, there is a period for which it is not necessary to apply the shutter. When the shutter is applied to the effective pixel columns during this period, there is a possibility of generation of a difference of exposure time in pixels in the same frame.

Further, as a means for dealing with cases where effective pixels cannot be selected, the example of another solid state imaging device not selecting any columns is shown in FIGS. 6A to 6F. For example, in the frame 2 of FIGS. 6A to 6F, during the horizontal synchronization periods h3 to h4, the read columns perform the read operation of the frame 1, the shutter 1 columns perform a non-selection operation, and the shutter 2 columns perform a non-selection operation. During the horizontal synchronization periods h4 to h5, the read columns perform a column non-selection operation, the shutter 1 columns perform a non-selection operation, and the shutter 2 columns perform the shutter operation of the frame 2. The number of selected columns in the period of the frame 2 is always one. The number of selected columns is one, the number of selected columns of the AND circuits of the pixel column selection circuits is one, and the input impedances and interconnect capacitances of the other AND circuits in the OFF state are added to the input thereof. The input impedance of the AND circuit during the OFF operation is large, and the input capacitance of this is small. Further, even when the interconnect capacitance is added to this, it is smaller than the number of ordinarily selected columns, therefore the rising time and the falling time become short. This waveform diagram is shown in FIG. 8A. Next, during the horizontal synchronization periods h5 to h6 of the frame 3, the number of selected columns is two, and two columns of AND of the pixel use column selection circuits are selected. Signals of the "H" level are output to these two columns, therefore only two AND circuits become the operation state, and the AND circuits other than them become the OFF state. Accordingly, the interconnect capacitances are further added to the input impedances of the AND circuits of the two selected columns and the input impedances of the AND circuits in the OFF state other than them, the rising time and the falling time become larger in comparison with FIG. 8A, and the result thereof is shown in FIG. 8B. Next, in the horizontal synchronization h6 to h7 periods of the frame 2, the number of selected columns becomes three, and three pixel columns are selected. The input impedances of the three AND circuits, the input impedances of the AND circuits in the OFF state other than them, and further interconnect capacitances are added, whereby the total input impedance is determined. As a result, the rising time and the falling time become further larger in comparison with FIG. 8B, and the ON periods of the reset (RST) switch and the transfer (TR) switch of the pixels become short (FIG. 9C). Below, this operation is repeated in the same way.

In this way, when the number of selected columns changes, the loads of the circuits for selecting the reset (RST) line (signal line) and the transfer (TR) line (dummy pixel use column selection circuit, effective pixel use column selection circuit) change, and also the rising time and the falling time change along with that. In this case as well, the variation of the rising time and the falling time becomes the variation of the ON period of the reset (RST) switch and the transfer (TR) switch of the pixels in the same way as FIGS. 4A to 4F.

Further, in each frame of the other solid state imaging device of FIGS. 7A to 7F as well, the number of selected columns becomes two in the frame 2, the number of selected columns becomes two in the horizontal synchronization periods h5 to h8 of the frame 3, the number of selected columns becomes two in the horizontal synchronization periods h8 to h9, the number of selected columns becomes one in the horizontal synchronization periods h9 to h10, . . . , therefore the number of selected columns changes between frames and also in the frames. The characteristics thereof are the same as those of FIGS. 6A to 6F, the load changes according to the number of selected columns, and as shown in FIGS. 8A, 8B, and 8C, and the rising time and the falling time change.

With respect to FIGS. 5A to 5E to FIGS. 7A to 7F explained above, in the operation of the pixel drive circuit 30, as shown in FIGS. 4A to 4F, the number of selected columns is always two and constant in frames, for example frame 2, frame 3, . . . , and the rising time and the falling time of the dummy or effective pixel use column selection circuit do not change. Further, hitherto the example of a solid state imaging device using a CMOS image sensor was shown, but an equivalent image sensor may be employed other than this. The present invention can be applied to also for example a threshold voltage modulation image sensor (VMIS). As a result, the ON periods of the reset (RST) switches, for example the MOS transistors, and the transfer (TR) switches, for example the MOR transistors, are made constant, and the variation of the reference potential levels (supplied by VSEL) of the floating diffusions FD according to the ON period of the reset (RST) switches can be eliminated. The variation of the ON period of the transfer (TR) switches is eliminated, and as a result of this, the variation of the charge transfer efficiency when transferring charges stored in the photodiodes PD to the floating diffusions FD can be eliminated, and the generation of unevenness in column units of the output signal level and afterimage can be eliminated. Further, since there are the same number of dummy columns as the number of read columns and shutter columns or more, the ratio of the selection of each dummy column is reduced, and the pixel deterioration of the dummy column can be suppressed.

It should be understood by those skilled in the art that various modifications, combinations, sub-combinations and alterations may occur depending on design requirements and other factors insofar as they are within the scope of the appended claims or the equivalents thereof.

What we claim is:

1. A solid state imaging device comprising:
    a pixel portion having a plurality of pixels in a two-dimensional array defined by columns and rows, the pixels configured for converting light signals into electric signals, the plurality of pixels arrayed arranged in columns in an effective pixel portion and a dummy pixel portion;
    a timing generator for generating address information for reading signals of pixels of said effective pixel portion and timing signals for reading pixels of said dummy pixel portion;
    a column decoder for outputting line selection signals for selecting a certain plurality of lines of pixels in one frame period based on said address information output from said timing generator;
    a column selection circuit for generating transfer signals and reset signals used for control of reading signals of pixels in the column portions of the pixel portion by said plurality of line selection signals output from said column decoder based on said timing signals and selecting column portions of pixels in said effective pixel portion and said dummy pixel portion; and a transfer circuit for reading signals of corresponding pixels based on said transfer signals and reset signals output from said column selection circuit, then transferring signals of read pixels by the row signal lines, wherein, the number of columns selected is held constant in the frame period by selecting the same number of columns of pixels in said dummy pixel portion as are selected for said effective pixel portion.

2. A solid state imaging device as set forth in claim 1, wherein said plurality of line selection signals output from said column decoder include pixel signal read output signals and a plurality of signals for instructing the reading end of pixel signals.

3. A solid state imaging device as set forth in claim 1, wherein in said column selection circuit, the number of the plurality of line selection signals supplied from said column decoder is constant and the input impedance is substantially constant in at least the frame period.

4. A solid state imaging device as set forth in claim 1, wherein the pixels of the dummy pixel portion of said pixel portion are configured the same as the pixels of the effective portion and are optically shielded.

5. A method of driving a solid state imaging device having a pixel portion having a plurality of pixels arrayed two-dimensionally defined by columns and rows and converting optical signals to electric signals, the plurality of pixels arrayed in an effective pixel portion and a dummy pixel portion in the form of columns, the method comprising:

a step of generating address information for reading signals of the pixels of said pixel portion and timing signals for reading;

a step of generating line selection signals for selecting a certain plurality of lines of pixels in one frame period based on said address information;

a step of generating transfer signals and reset signals used for control for reading signals of pixels in the column portions of the pixel portion by said plurality of line selection signals based on said timing signals and selecting column portions of pixels in an effective portion and a dummy portion of said pixel portion; and a step of reading signals of corresponding pixels based on said transfer signals and reset signals output, then transferring signals of read pixels by the row signal lines, wherein the number of columns selected is held constant in the frame period by selecting the same number of columns of pixels in said dummy pixel portion as are selected for said effective pixel portion.

6. A method of driving a solid state imaging device as set forth in claim 5, wherein the line selection signal contains a pixel signal reading signal and an output signal instructing the termination of the read of the plurality of the pixel signals.

7. A method of driving a solid state imaging device as set forth in claim 5, wherein the number of the line selection signals supplied from said column decoder is constant and the input impedance is substantially constant in at least the frame period.

8. An imaging apparatus comprising:

a solid state imaging device having a pixel portion having a plurality of pixels arrayed two-dimensional state defined by columns and rows and converting optical signals to electric signals, the plurality of pixels arrayed in an effective pixel portion and a dummy pixel portion in the form of columns;

an optical system for guiding incident light to said pixel portion;

a timing generator for generating address information for selecting the pixels of said pixel portion and timing signals for reading the signals from the selected pixels;

a column decoder for outputting line selection signals for selecting a certain plurality of lines of pixels in one frame period based on said address information output from said timing generator;

a column selection circuit for generating transfer signals and reset signals used for control for reading signals of pixels in the column portions of the pixel portion by said plurality of line selection signals output from said column decoder based on said timing signals and selecting column portions of pixels in an effective portion and a dummy portion of said pixel portion;

a transfer circuit for reading signals of corresponding pixels based on said transfer signals and reset signals output from said column selection circuit, then transferring signals of read pixels by the row signal lines; and a signal processing circuit for processing said pixel signals transferred by said transfer circuit as imaging signals, wherein, the number of columns selected is held constant in the frame period by selecting the same number of columns of pixels in said dummy pixel portion as are selected for said effective pixel portion.

* * * * *